US012588170B2

(12) United States Patent (10) Patent No.: US 12,588,170 B2
Takabayashi (45) Date of Patent: Mar. 24, 2026

(54) IN-VEHICLE DEVICE INCLUDING COOLING APPARATUS

(71) Applicant: Mitsubishi Electric Corporation, Tokyo (JP)

(72) Inventor: Hirokazu Takabayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 273 days.

(21) Appl. No.: 18/263,969

(22) PCT Filed: Mar. 11, 2021

(86) PCT No.: PCT/JP2021/009878
§ 371 (c)(1),
(2) Date: Aug. 2, 2023

(87) PCT Pub. No.: WO2022/190325
PCT Pub. Date: Sep. 15, 2022

(65) Prior Publication Data
US 2024/0306349 A1 Sep. 12, 2024

(51) Int. Cl.
*H05K 7/20* (2006.01)
(52) U.S. Cl.
CPC ..... *H05K 7/20863* (2013.01); *H05K 7/20854* (2013.01)
(58) Field of Classification Search
CPC ........... H05K 7/20863; H05K 7/20854; H05K 7/20145; H05K 7/20918; H05K 7/20163; H05K 7/20136
See application file for complete search history.

(56) References Cited

U.S. PATENT DOCUMENTS 6,504,718 B2 * 1/2003 Wu .................... H05K 7/20727
174/15.1
11,089,714 B2 * 8/2021 Lin ....................... H05K 1/0203
(Continued)

FOREIGN PATENT DOCUMENTS

JP 2009130258 A 6/2009
JP 2011188671 A 9/2011
(Continued)

OTHER PUBLICATIONS

International Search Report (PCT/ISA/210) with translation and Written Opinion (PCT/ISA/237) mailed on Jun. 1, 2021, by the Japan Patent Office as the International Searching Authority for International Application No. PCT/JP2021/009878. (12 pages).
(Continued)

*Primary Examiner* — Jayprakash N Gandhi
*Assistant Examiner* — Matthew Sinclair Muir
(74) *Attorney, Agent, or Firm* — .Buchanan Ingersoll & Rooney PC

(57) ABSTRACT

A cooler includes a heat-receiving block, multiple heat-dissipating members, and a channel definer. The heat-receiving block has a first main surface to which a heating element is attachable, and a second main surface opposite to the first main surface. The multiple heat-dissipating members are fixed to the second main surface with spaces therebetween. The multiple heat-dissipating members dissipate heat transferred from the heating element through the heat-receiving block to air flowing through the spaces. The channel definer covers the multiple heat-dissipating members and is fixed to the second main surface of the heat-receiving block. The channel definer defines a flow channel for the air flowing through the spaces between the multiple heat-dissipating members. The channel definer includes
(Continued)

multiple vents for the air to flow into the flow channel and for the air drawn in the flow channel to flow out.

15 Claims, 9 Drawing Sheets

(56)            References Cited

U.S. PATENT DOCUMENTS

| | | | |
|---|---|---|---|
| 2007/0284095 A1* | 12/2007 | Wang | F28D 7/10 |
| | | | 165/165 |
| 2008/0180905 A1* | 7/2008 | Peng | G06F 1/20 |
| | | | 361/679.48 |
| 2011/0222243 A1 | 9/2011 | Nagami et al. | |
| 2011/0247787 A1* | 10/2011 | Liu | G06F 1/20 |
| | | | 165/104.28 |
| 2012/0006514 A1* | 1/2012 | Bratkovski | H01L 23/367 |
| | | | 165/185 |
| 2019/0166729 A1 | 5/2019 | Kitanaka et al. | |
| 2019/0208671 A1 | 7/2019 | Kitanaka et al. | |
| 2020/0178416 A1* | 6/2020 | Mitsuzawa | H05K 7/20154 |
| 2022/0271710 A1* | 8/2022 | Zheng | H05K 7/20918 |

FOREIGN PATENT DOCUMENTS

| | | |
|---|---|---|
| JP | 2012183982 A | 9/2012 |
| JP | 2019129229 A | 8/2019 |
| JP | 2020036456 A | 3/2020 |
| WO | 2017208384 A1 | 12/2017 |
| WO | 2018020615 A1 | 2/2018 |

OTHER PUBLICATIONS

Japanese Office Action dated Jun. 13, 2023, issued for the corresponding JP patent application No. 2023-505017 and the English translation.

* cited by examiner

IN-VEHICLE DEVICE INCLUDING COOLING APPARATUS

TECHNICAL FIELD

The present disclosure relates to a cooler and an in-vehicle device including the cooler.

BACKGROUND ART

In-vehicle devices may include coolers thermally connected to electronic components to prevent heat damage on the electronic components during energization. A cooler dissipates heat transferred from an electronic component to air around the cooler. Thus, the electronic component is cooled. An example cooler cools an electronic component by dissipating heat transferred from the electronic component to cooling air drawn by a blower into a duct in an in-vehicle device. An example in-vehicle device including such a cooler is described in Patent Literature 1. An underfloor device described in Patent Literature 1 includes a duct for feeding cooling air, a blower for blowing cooling air to the duct, and a cooler including a heat dissipater located in the duct.

CITATION LIST

Patent Literature

Patent Literature 1: Unexamined Japanese Patent Application Publication No. 2012-183982

SUMMARY OF INVENTION

Technical Problem

The underfloor device described in Patent Literature 1 includes the duct for feeding cooling air drawn from outside into an enclosed compartment with limited outside air inflow. This underfloor device also includes the cooler including the heat dissipater located in the duct for dissipating heat transferred from an electronic component accommodated in the enclosed compartment to cooling air. Thus, the underfloor device is to include the duct in which the heat dissipater as a part of the cooler is to be located. The underfloor device has a complicated structure. This issue is not limited to the underfloor device and may occur to any device including a cooler.

In response to the above circumstances, an objective of the present disclosure is to provide a cooler that can simplify the structure of an in-vehicle device, and an in-vehicle device with a simpler structure.

Solution to Problem

To achieve the above objective, a cooler according to an aspect of the present disclosure includes a heat-receiving block, a plurality of heat-dissipating members, and a channel definer. The heat-receiving block has a first main surface to which a heating element is attachable. The plurality of heat-dissipating members are fixed to a second main surface of the heat-receiving block opposite to the first main surface with spaces therebetween. The plurality of heat-dissipating members dissipate heat transferred from the heating element through the heat-receiving block to air flowing through the spaces. The channel definer covers the plurality of heat-dissipating members and is fixed to the second main surface of the heat-receiving block. The channel definer defines a flow channel for the air flowing through the spaces between the plurality of heat-dissipating members. The channel definer includes a plurality of vents for the air to flow into the flow channel and for the air drawn in the flow channel to flow out.

Advantageous Effects of Invention

The cooler according to the above aspect of the present disclosure includes the flow channel extending through the spaces between the heat-dissipating members. An in-vehicle device including the cooler thus includes no duct. The in-vehicle device thus has a simpler structure.

DESCRIPTION OF EMBODIMENTS

A cooler and an in-vehicle device according to embodiments of the present disclosure are described in detail with reference to the drawings. In the figures, the same reference signs denote the same or equivalent components.

Embodiment 1

Figure 1:
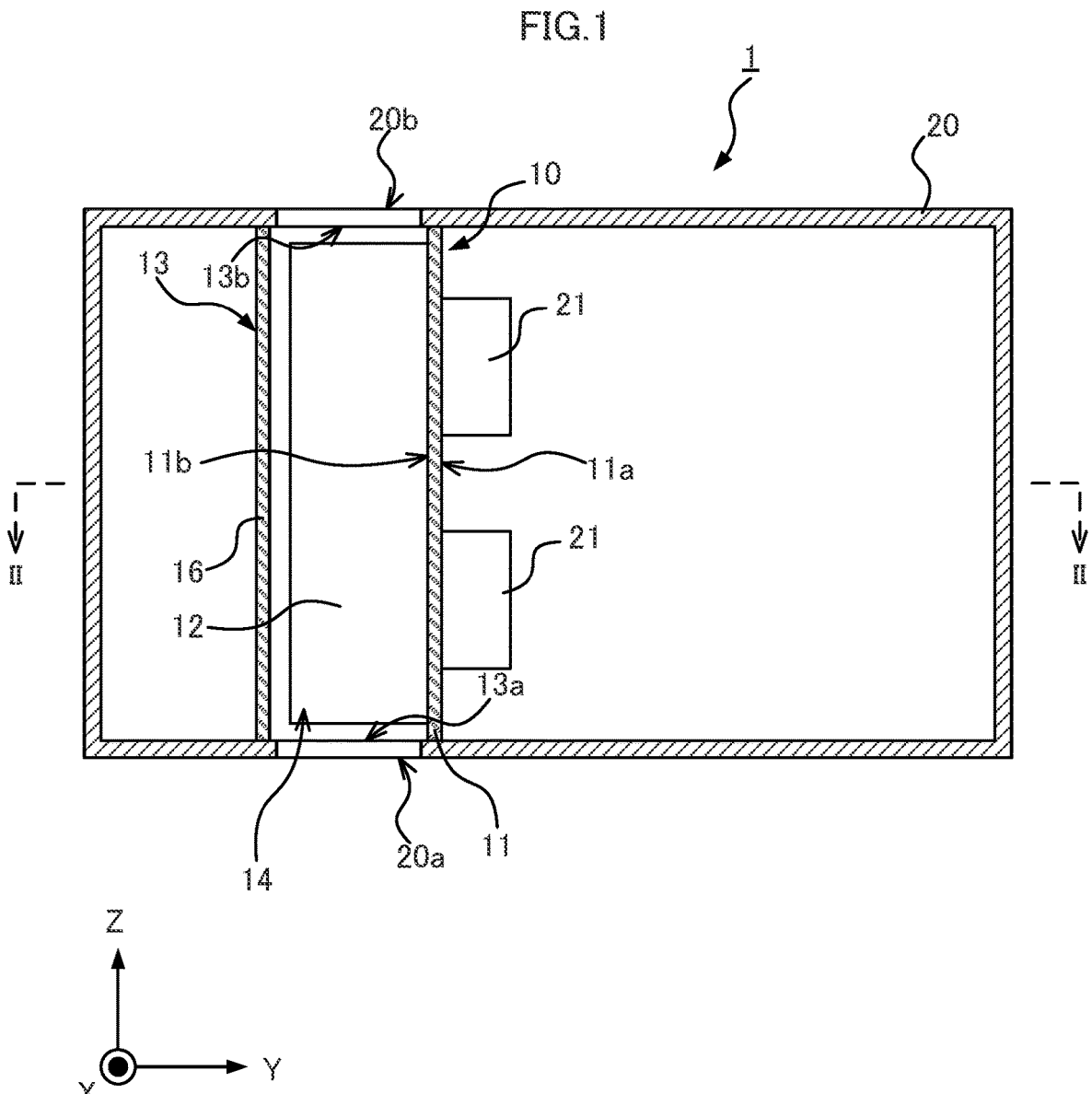
FIG. 1 is a cross-sectional view of an in-vehicle device according to Embodiment 1.
Figure 2:
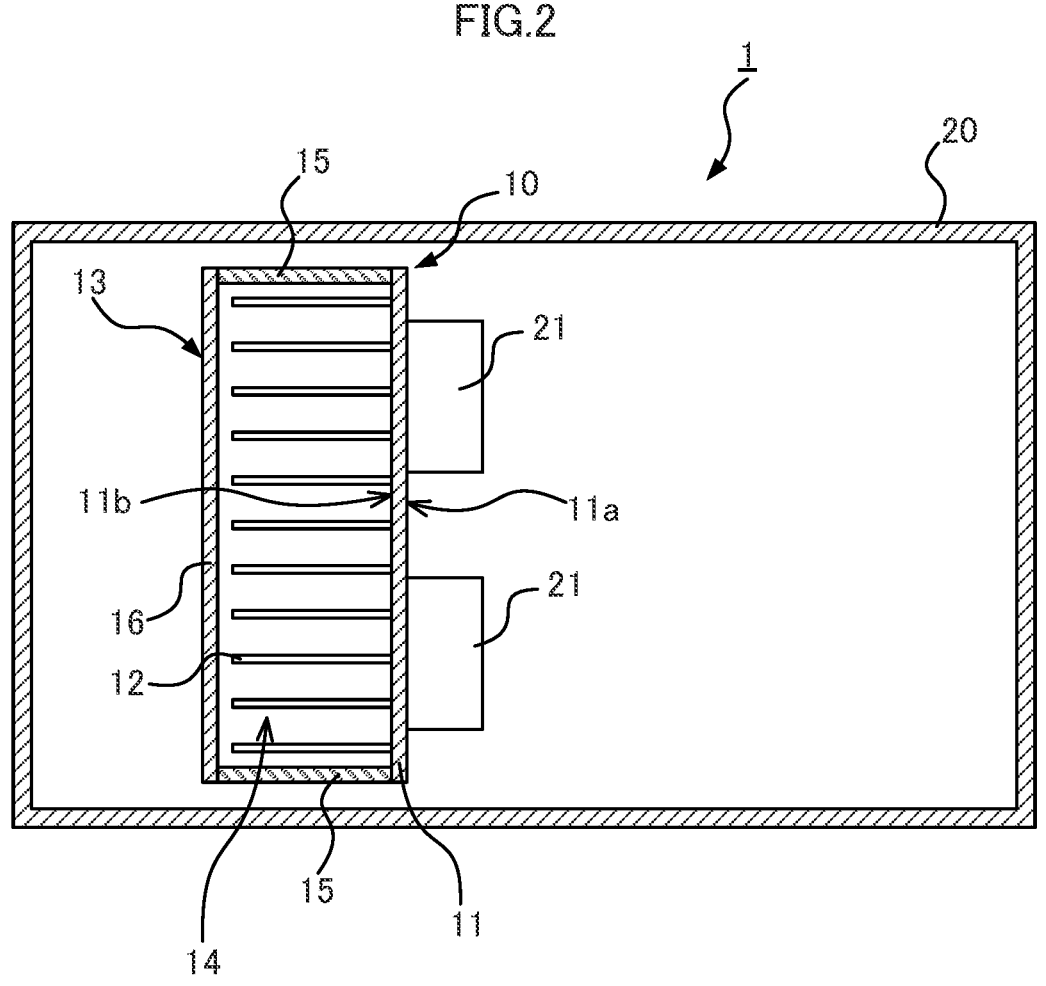
FIG. 2 is a cross-sectional view of the in-vehicle device according to Embodiment 1 taken along line II-II as viewed in the direction indicated by the arrows in FIG. 1.
Figure 2:
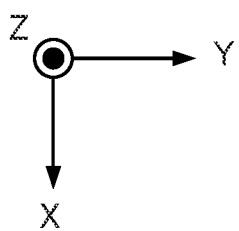

In Embodiment 1, an in-vehicle device 1 is described using an example in-vehicle device mountable on a railway vehicle. The in-vehicle device 1 illustrated in FIG. 1 and in FIG. 2 being a cross-sectional view taken along line II-II as viewed in the direction indicated by the arrows in FIG. 1 includes a housing 20 mountable on a railway vehicle, electronic components 21 accommodated in the housing 20, and a cooler 10 entirely accommodated in the housing 20 to cool the electronic components 21. In FIGS. 1 and 2, Z-axis indicates a vertical direction. Y-axis indicates a traveling direction of the railway vehicle. X-axis indicates a width direction of the railway vehicle. X-, Y-, and Z-axes are orthogonal to one another.

The in-vehicle device 1 is, for example, a power conversion device that converts power supplied from an overhead line to three-phase alternating current (AC) power to be supplied to electric motors for generating a driving force for a railway vehicle, and supplies the three-phase AC power to a main electric motor. The in-vehicle device 1 as a power conversion device includes, for example, switching elements as the electronic components 21 that are heating elements. The in-vehicle device 1 includes the cooler 10 for preventing heat failure of the electronic components 21 during energization. The cooler 10 has an internal flow channel, and thus the in-vehicle device 1 includes no duct. The in-vehicle device 1 has a simpler structure than an in-vehicle device including a duct.

The components of the in-vehicle device 1 are described in detail.

The housing 20 is mounted under the floor of a railway vehicle with attachments, which are not illustrated. The housing 20 has two surfaces facing in Z-direction. One surface of the housing 20 has a first opening 20a, and the other surface has a first opening 20b. In detail, the housing 20 has the first opening 20a in the vertically lower surface, and the first opening 20b in the vertically upper surface.

The housing 20 accommodates the electronic components 21.

Figure 3:
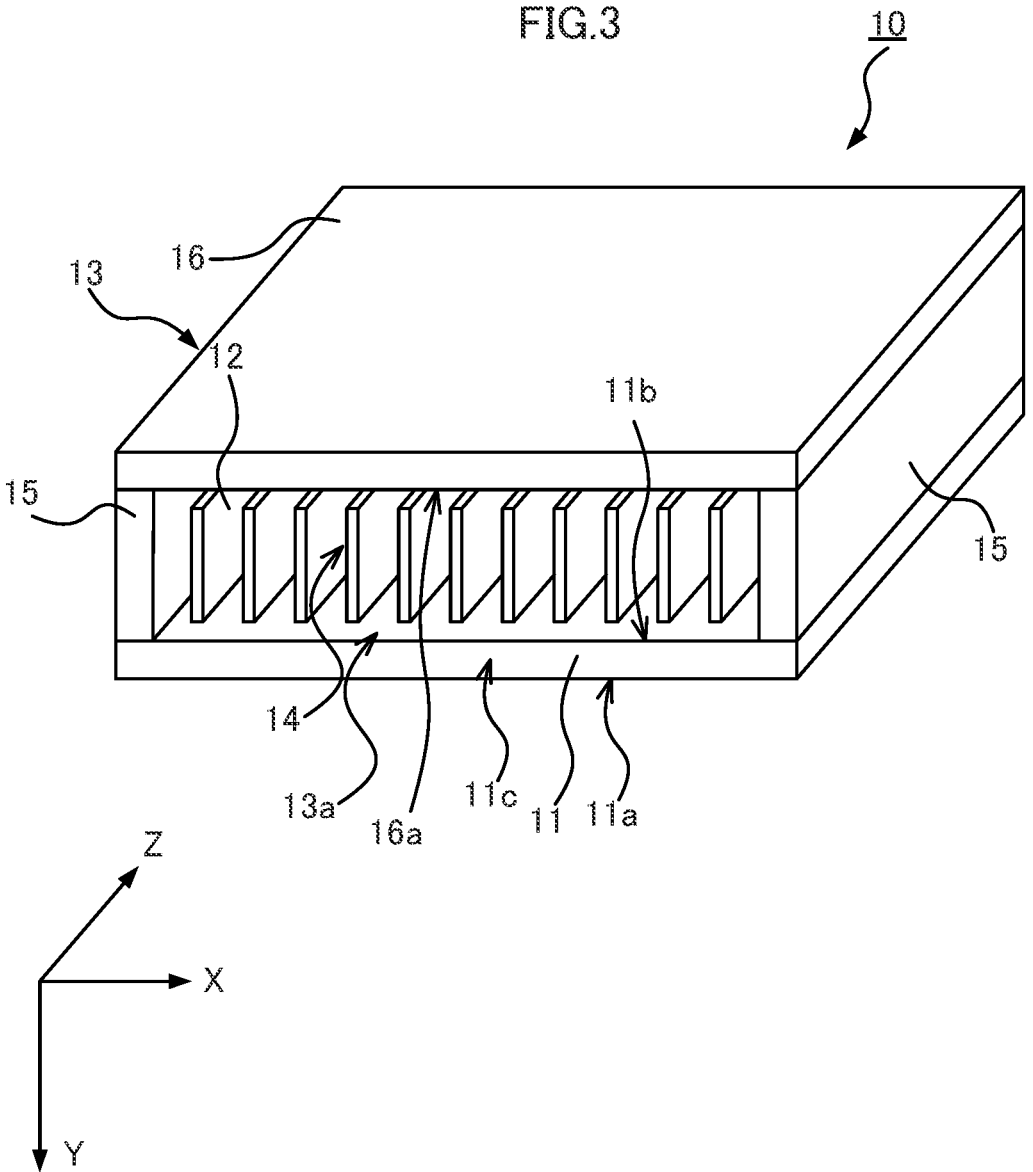
FIG. 3 is a perspective view of a cooler according to Embodiment 1.
Figure 4:
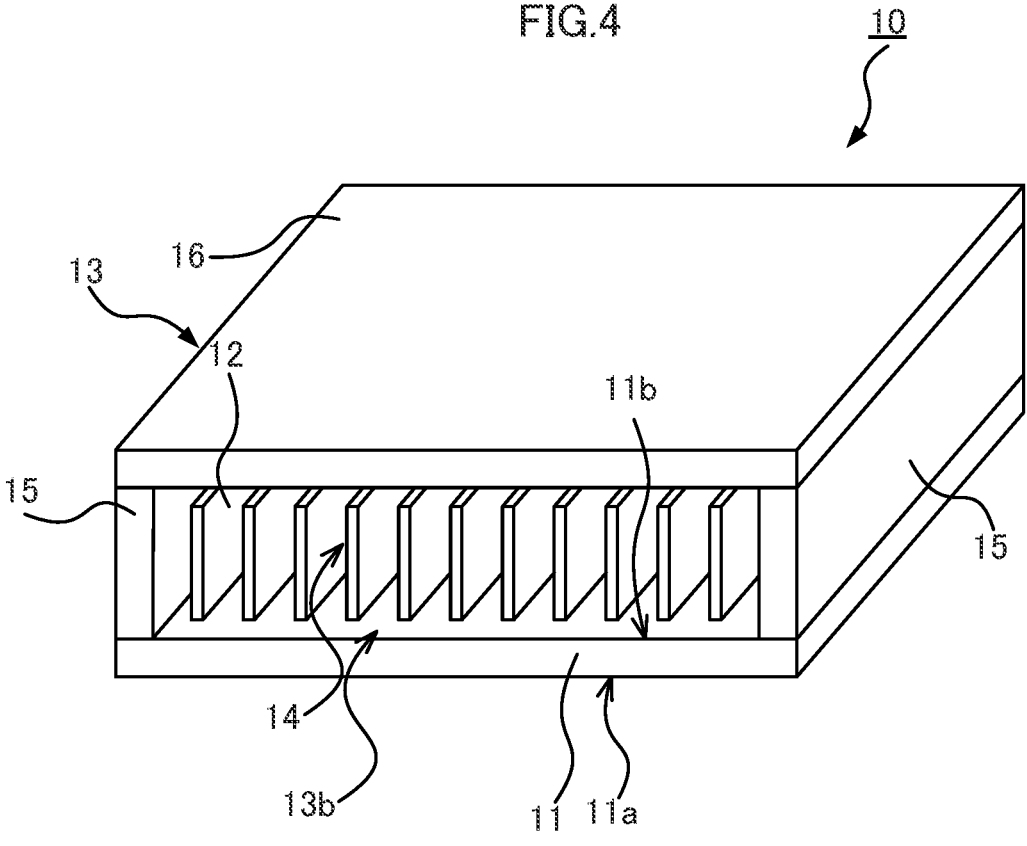
FIG. 4 is a perspective view of the cooler according to Embodiment 1.
Figure 4:
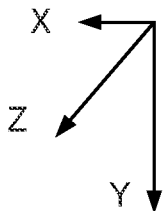

As illustrated in FIGS. 3 and 4, the cooler 10 includes a heat-receiving block 11 with a first main surface 11a to which heating elements including the electronic components 21 are attached, multiple heat-dissipating members 12 fixed to a second main surface 11b of the heat-receiving block 11 with spaces therebetween, and a channel definer 13 defining a flow channel 14 for air flowing through the spaces between the multiple heat-dissipating members 12. FIG. 3 is a view of the cooler 10 accommodated in the housing 20 as viewed from below in the vertical direction. FIG. 4 is a view of the cooler 10 accommodated in the housing 20 as viewed from above in the vertical direction.

The heat-receiving block 11 has the first main surface 11a and the second main surface 11b opposite to the first main surface 11a. The heat-receiving block 11 is preferably a flat plate member. In Embodiment 1, the first main surface 11a faces the second main surface 11b in Y-direction. The heat-receiving block 11 is formed from a highly thermally conductive material, for example, metal such as copper or aluminum.

The multiple heat-dissipating members 12 are fixed to the second main surface 11b of the heat-receiving block 11 with spaces therebetween. Each heat-dissipating member 12 dissipates heat transferred from the electronic components 21 through the heat-receiving block 11 to air flowing through the spaces. In Embodiment 1, the heat-dissipating members 12 are fins. In detail, the heat-dissipating members 12 are fins with main surfaces parallel to the YZ plane, and are fixed to the second main surface 11b at intervals in X-direction.

The heat-dissipating members 12 are formed from a highly thermally conductive material, for example, metal such as copper or aluminum. The heat-dissipating members 12 are fixed to the second main surface 11b of the heat-receiving block 11 with any method such as fitting, brazing, welding, attaching with adhesives, or fastening with fasteners. More specifically, the heat-dissipating members 12 may be fixed to the heat-receiving block 11 firmly for the heat-dissipating members 12 and the heat-receiving block 11 to maintain a constant positional relationship under vibration from a traveling railway vehicle.

The channel definer 13 covers the multiple heat-dissipating members 12 and is fixed to the second main surface 11b of the heat-receiving block 11 to define the flow channel 14 for air flowing through spaces between the multiple heat-dissipating members 12. In detail, the channel definer 13 defines the flow channel 14 extending in Z-direction. The channel definer 13 includes multiple vents, or more specifically, a vent 13a for air to flow into the flow channel 14 and a vent 13b for air in the flow channel 14 to flow out. In Embodiment 1, the vents 13a and 13b face each other in Z-direction. The vent 13a is located vertically downward from the vent 13b.

As illustrated in FIG. 1, the cooler 10 with the above structure is attached to the housing 20 with the vent 13a in the channel definer 13 facing the first opening 20a in the housing 20 and the vent 13b in the channel definer 13 facing the first opening 20b in the housing 20. The first opening 20a is preferably smaller than the vent 13a. The edge of the first opening 20a is preferably located inward from the edge of the vent 13a on the XY plane. The first opening 20b is preferably smaller than the vent 13b. The edge of the first opening 20b is preferably located inward from the edge of the vent 13b on the XY plane. With the cooler 10 attached to the housing 20 as described above, the first opening 20a is connected to the vent 13a, and the first opening 20b is connected to the vent 13b. The channel definer 13 thus defines the flow channel 14 connecting to the outside of the housing 20 through the first openings 20a and 20b. The vertically extending flow channel 14 generates, without a blower, a vertically upward airflow from the first opening 20a through the flow channel 14 toward the first opening 20b. Thus, the electronic components 21 may be cooled by natural air-cooling.

The structure of the channel definer 13 is described in detail below.

As illustrated in FIGS. 3 and 4, the channel definer 13 in Embodiment 1 includes a pair of side wall members 15 and a lid member 16.

Figure 5:
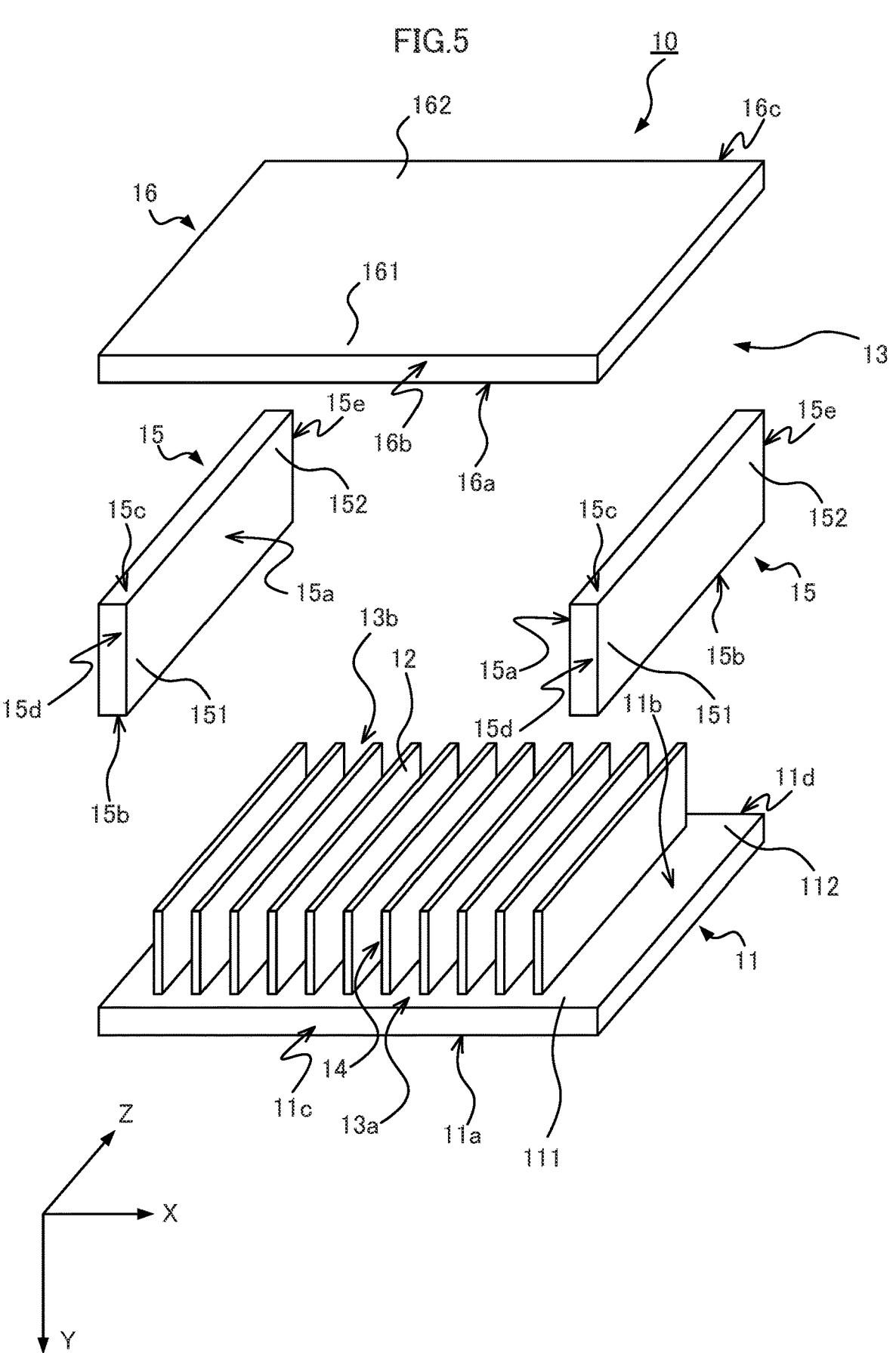
FIG. 5 is an exploded perspective view of the cooler according to Embodiment 1.

As illustrated in FIG. 5 being an exploded perspective view of FIG. 3, the pair of the side wall members 15 are each a plate and are fixed to the heat-receiving block 11 in a direction in which main surfaces 15a of the side wall members 15 face each other with the multiple heat-dissipating members 12 in between. In detail, the side wall members 15 are each fixed to the heat-receiving block 11 with a side surface 15b being one of two longitudinal side surfaces of the corresponding side wall member 15 in contact with the second main surface 11b. The side wall members 15 may be fixed to the heat-receiving block 11 firmly for the side wall members 15 and the heat-receiving block 11 to maintain a constant positional relationship under vibration from a traveling railway vehicle.

The side wall members 15 are strong enough not to deform under vibration from a traveling railway vehicle. Each side wall member 15 is formed from, for example, an aluminum plate having a thickness of at least 10 millimeters.

The lid member 16 is a plate and is fixed to the pair of side wall members 15 in a direction in which the lid member 16 faces the second main surface 11b of the heat-receiving block 11 with the multiple heat-dissipating members 12 in between. In detail, the lid member 16 is fixed to the side wall members 15 with a main surface 16a in contact with side surfaces 15c each being the other one of two longitudinal side surfaces of the corresponding side wall member 15. In other words, the lid member 16 is fixed to the pair of side wall members 15 with the multiple heat-dissipating members 12 and the pair of side wall members 15 between the lid member 16 and the second main surface 11b. Each side wall member 15 has the side surface 15c opposite to the side surface 15b. The lid member 16 may be fixed to the side wall members 15 firmly for the lid member 16 and the side wall members 15 to maintain a constant positional relationship under vibration from a traveling railway vehicle.

The lid member 16 is strong enough not to deform under vibration from a traveling railway vehicle. The lid member 16 is formed from, for example, an aluminum plate having a thickness of at least 10 millimeters.

The vent 13*a* is a space surrounded by ends 151 of the side wall members 15, an end 161 of the lid member 16, and an end 111 of the heat-receiving block 11. Each end 151 is a portion of the side wall member 15 including one end in Z-direction. The end 151 has an end face 15*d* intersecting with Z-direction. The end 161 is a portion of the lid member 16 including one end in Z-direction. The end 161 has an end face 16*b* intersecting with Z-direction. The end 111 is a portion of the heat-receiving block 11 including one end in Z-direction. The end 111 has an end face 11*c* intersecting with Z-direction.

The vent 13*b* is a space surrounded by ends 152 of the side wall members 15, an end 162 of the lid member 16, and an end 112 of the heat-receiving block 11. Each end 152 is a portion of the side wall member 15 including the other end in Z-direction. The end 152 has an end face 15*e* intersecting with Z-direction. The end 162 is a portion of the lid member 16 including the other end in Z-direction. The end 162 has an end face 16*c* intersecting with Z-direction. The end 112 is a portion of the heat-receiving block 11 including the other end in Z-direction. The end 112 has an end face 11*d* intersecting with Z-direction.

As described above, the heat-receiving block 11, the pair of side wall members 15, and the lid member 16 define the flow channel 14 extending from the vent 13*a* through spaces between the heat-dissipating members 12 to the vent 13*b*. As illustrated in FIG. 1, the cooler 10 is attached to the housing 20 with the vent 13*a* facing the first opening 20*a* in the housing 20 and the vent 13*b* facing the first opening 20*b* in the housing 20. This allows air outside the housing 20 to flow into the first opening 20*a* of the housing 20, travel through the flow channel 14, and flow out of the housing 20 through the first opening 20*b*. The heat generated by the electronic components 21 is dissipated to the air flowing through the flow channel 14 through the heat-receiving block 11 and the heat-dissipating members 12. This cools the electronic components 21. As illustrated in FIG. 2, the flow channel 14 is separated from an internal space of the housing 20 accommodating the electronic components 21 by the heat-receiving block 11, the pair of side wall members 15, and the lid member 16. Thus, flowing of air into the housing 20 accommodating the electronic components 21 from the flow channel 14 is reduced.

As described above, air outside the housing 20 flows through the flow channel 14. The in-vehicle device 1 is expected to have sealability sufficient for reducing flowing of air from outside the housing 20 into the internal space of the housing 20 accommodating the electronic components 21.

Portions of the cooler 10 that are in contact with the housing 20 are thus preferably smooth and flat surfaces. In detail, the end faces 15*d* and 15*e* of each side wall member 15 illustrated in FIG. 5 are preferably smooth flat surfaces that allow surface contact with the housing 20. The end faces 11*c* and 11*d* of the heat-receiving block 11 are preferably smooth flat surfaces. The end faces 16*b* and 16*c* of the lid member 16 are preferably smooth flat surfaces that allow surface contact with the housing 20.

The end faces 15*d* of the side wall members 15 and the end face 11*c* of the heat-receiving block 11 defining the vent 13*a* are preferably connected smoothly to each other. Being smoothly connected refers to the slope of a tangent plane being continuous. In Embodiment 1, the end faces 15*d* are flush with the end face 11*c*. The end faces 15*d* of the side wall members 15 and the end face 16*b* of the lid member 16 defining the vent 13*a* are preferably connected smoothly to each other. In Embodiment 1, the end faces 15*d* are flush with the end face 16*b*. In other words, the end faces 15*d*, 11*c*, and 16*b* are flush with one another.

Similarly, the end faces 15*e* of the side wall members 15 and the end face 11*d* of the heat-receiving block 11 defining the vent 13*b* are preferably connected smoothly to each other. In Embodiment 1, the end faces 15*e* are flush with the end face 11*d*. The end faces 15*e* of the side wall members 15 and the end face 16*c* of the lid member 16 defining the vent 13*b* are preferably connected smoothly to each other. In Embodiment 1, the end faces 15*e* are flush with the end face 16*c*. In other words, the end faces 15*e*, 11*d*, and 16*c* are flush with one another.

To improve the sealability of the in-vehicle device 1, the cooler 10 preferably includes a channel sealing member that seals the channel definer 13 fixed to the heat-receiving block 11, with the vents 13*a* and 13*b* being uncovered. The flow channel 14 is thus sealed with the channel sealing member, with the vents 13*a* and 13*b* being uncovered. In other words, flowing of air into or out of air the flow channel 14 without flowing through the vents 13*a* and 13*b* is reduced. Thus, flowing of air traveling through the flow channel 14 into the internal space of the housing 20 accommodating the electronic components 21 is reduced. Thus, the in-vehicle device 1 may have improved sealability.

In detail, the cooler 10 preferably includes a first channel sealing member filling a space between each of the side surfaces 15*b* of the side wall members 15 and the second main surface 11*b* of the heat-receiving block 11 to have sealability. The first channel sealing member is, for example, a waterproof and dustproof resin. For example, contact portions in which the side surfaces 15*b* of the side wall members 15 are to be in contact with the second main surface 11*b* of the heat-receiving block 11 may be treated to be waterproof and dustproof with a resin applied before the side wall members are fixed to the heat-receiving block 11 with fasteners. As described above, with the contact portions in which the side surfaces 15*b* of the side wall members 15 are to be in contact with the second main surface 11*b* of the heat-receiving block 11 treated to be waterproof and dustproof for being sealable, the in-vehicle device 1 may have improved sealability.

Preferably, the cooler 10 also includes a second channel sealing member filling a space between each of the side surfaces 15*c* of the side wall members 15 and the main surface 16*a* of the lid member 16 to have sealability. The second channel sealing member is, for example, a waterproof and dustproof resin. For example, portions in which the side surfaces 15*c* of the side wall members 15 are to be in contact with the main surface 16*a* of the lid member 16 may be treated to be waterproof and dustproof with a resin applied before the side wall members 15 and the lid member 16 are fastened with fasteners. As described above, with the portions in which the side surfaces 15*c* of the side wall members 15 are to be in contact with the main surface 16*a* of the lid member 16 treated to be waterproof and dustproof for being sealable, the in-vehicle device 1 may have improved sealability.

As described above, with the cooler 10 according to Embodiment 1 including the flow channel 14 for feeding air in the cooler 10, the in-vehicle device 1 is to include no duct for feeding cooling air. The in-vehicle device 1 thus has a simpler structure than an in-vehicle device including a duct.

In a structure including a duct, the entire duct is to be treated to be waterproof and dustproof. A device to be installed on, in particular, a railway vehicle is larger and thus includes an elongated duct. In this structure, many portions are to be treated to be waterproof and dustproof, complicating the manufacturing process. In contrast, the in-vehicle device 1 according to Embodiment 1 includes no duct, and thus has fewer portions to be treated to be waterproof and dustproof. The manufacturing process is thus simpler.

Embodiment 2

Although the in-vehicle device 1 described in Embodiment 1 performs natural air-cooling of the electronic components 21 by allowing outside air to flow through the flow channel 14 and dissipating heat generated by the electronic components 21 to the air through the heat-receiving block 11 and the heat-dissipating members 12, an in-vehicle device may perform forced air-cooling. An in-vehicle device 2 for forced air-cooling is described in Embodiment 2.

Figure 6:
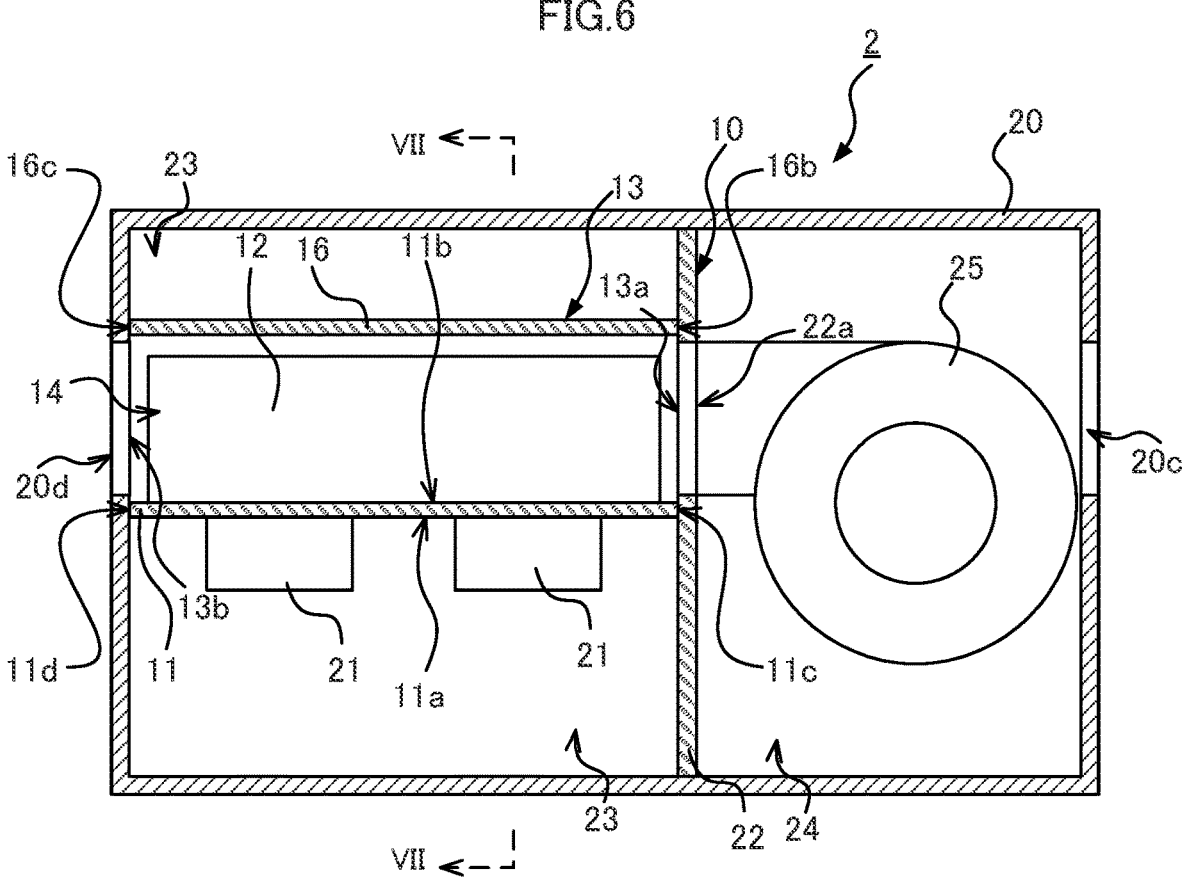
FIG. 6 is a cross-sectional view of an in-vehicle device according to Embodiment 2.
Figure 6:
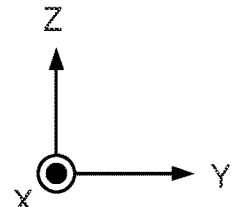

As illustrated in FIG. 6, the in-vehicle device 2 includes, in addition to the components of the in-vehicle device 1 according to Embodiment 1, a partition member 22 that divides the internal space of the housing 20 into a first space 23 and a second space 24, and a blower 25 in the second space 24. The electronic components 21 and an overall portion of the cooler 10 are accommodated in the first space 23.

The partition member 22 is located in the housing 20 with a main surface orthogonal to Y-direction, and divides the interior of the housing 20 into the first space 23 and the second space 24. The partition member 22 has a second opening 22a facing the vent 13a in the channel definer 13 included in the cooler 10 accommodated in the first space 23. The second opening 22a is preferably smaller than the vent 13a. The edge of the second opening 22a is preferably located inward from the edge of the vent 13a on the XZ plane.

The housing 20 has two surfaces facing in Y-direction. One surface of the housing 20 has an intake-exhaust port 20c, and the other surface has a first opening 20d. In detail, the intake-exhaust port 20c is located in a surface of the housing 20 that faces the second space 24 and is orthogonal to Y-axis. The intake-exhaust port 20c allows air outside the housing 20 to flow into the second space 24 or allows air in the second space 24 to flow out of the housing 20. A first opening 20d is located in a surface of the housing 20 that faces the first space 23 and is orthogonal to Y-axis. The first opening 20d faces the vent 13b in the channel definer 13 included in the cooler 10 accommodated in the first space 23. The first opening 20d is preferably smaller than the vent 13b. The edge of the first opening 20d is preferably located inward from the edge of the vent 13b on the XZ plane.

Figure 7:
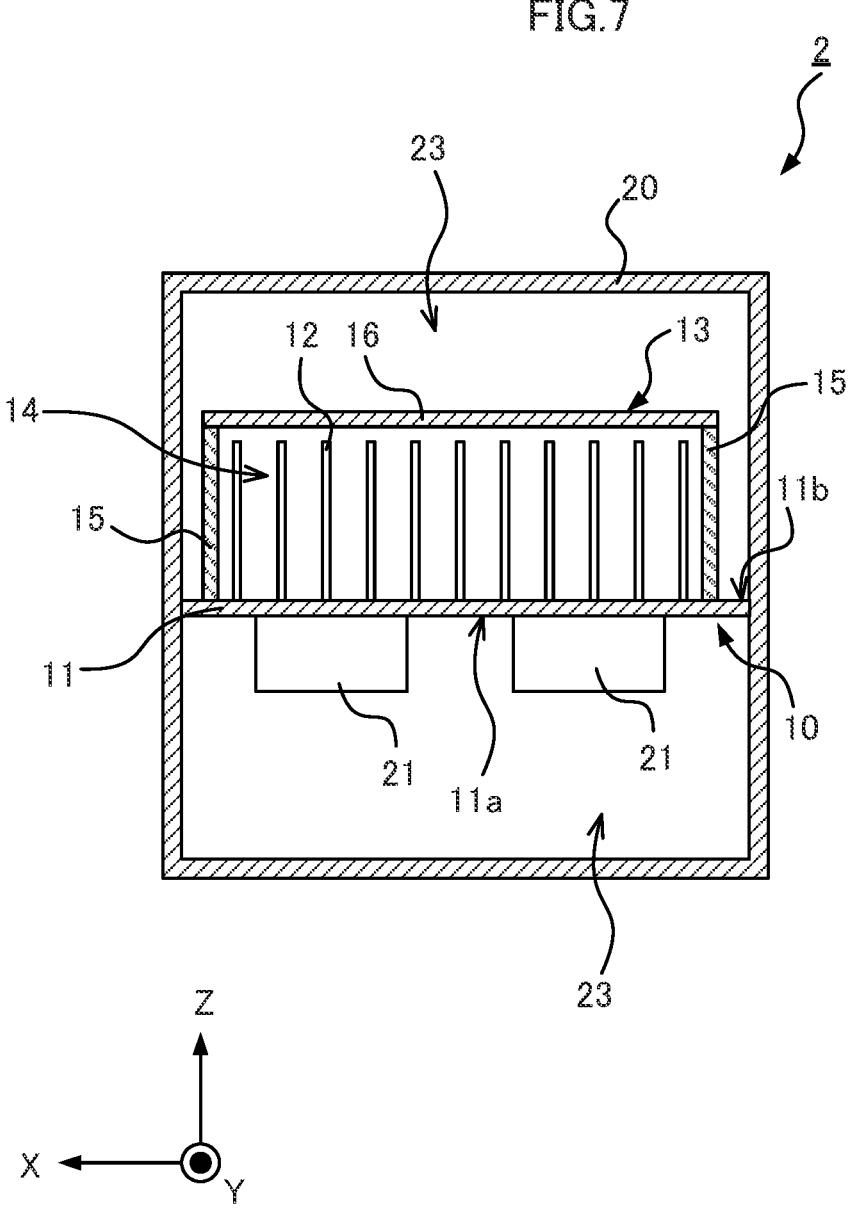
FIG. 7 is a cross-sectional view of the in-vehicle device according to Embodiment 2 taken along line VII-VII as viewed in the direction indicated by the arrows in FIG. 6.

As illustrated in FIG. 7 being a cross-sectional view taken along line VII-VII as viewed in the direction indicated by the arrows in FIG. 6, the cooler 10 included in the in-vehicle device 2 includes the same components as the cooler 10 in the in-vehicle device 1, except that the heat-receiving block 11 has a larger area than the lid member 16. In detail, the heat-receiving block 11 is wider than the lid member 16 in X-direction.

As illustrated in FIG. 6, the cooler 10 is fixed to the housing 20 and the partition member 22, with the vent 13a in the channel definer 13 facing the second opening 22a in the partition member 22 and with the vent 13b in the channel definer 13 facing the first opening 20d in the housing 20. Thus, the second opening 22a is connected to the vent 13a, and the first opening 20d is connected to the vent 13b. The channel definer 13 thus defines the flow channel 14 connecting to the outside of the housing 20 through the second opening 22a, the second space 24, and the intake-exhaust port 20c. The flow channel 14 connects to the outside of the housing 20 through the first opening 20d.

As illustrated in FIGS. 6 and 7, the cooler 10 is fixed to the housing 20 with three surfaces connected to the first main surface 11a and the second main surface 11b of the heat-receiving block 11 in contact with the housing 20 and with another side surface in contact with the partition member 22. In detail, the cooler 10 is fixed to the housing 20 with the end face 11c in contact with the partition member 22 and the remaining three surfaces including the end face 11d in contact with the housing 20, of the four surfaces connected to the first main surface 11a and the second main surface 11b. In this case, the end face 16b of the lid member 16 is in contact with the partition member 22, and the end face 16c of the lid member 16 is in contact with the housing 20.

With the cooler 10 fixed to the housing 20 as described above, flowing of air outside the housing 20 into a space between the cooler 10 and the housing 20 in the first space 23 is reduced. The air outside the housing 20 flows into the second space 24 through the intake-exhaust port 20c.

With the blower 25 illustrated in FIG. 6, air outside the housing 20 that flows through the intake-exhaust port 20c in the housing 20 into the second space 24 is blown to the flow channel 14 in the cooler 10. In detail, the blower 25 has an outlet connected to the second opening 22a. The blower 25 draws air outside the housing 20 flowing into the second space 24, and then blows the air out through the second opening 22a to the flow channel 14 in the cooler 10.

The air outside the housing 20 that flows through the intake-exhaust port 20c in the housing 20 into the second space 24 is drawn by the blower 25 and is blown out through the outlet in the blower 25 to the flow channel 14. The air blown out from the blower 25 into the flow channel 14 travels through the flow channel 14 and is released through the first opening 20d in the housing 20 to outside the housing 20. The heat generated by the electronic components 21 is dissipated to the air flowing through the flow channel 14 through the heat-receiving block 11 and the heat-dissipating members 12. This cools the electronic components 21. As illustrated in FIGS. 6 and 7, the flow channel 14 is separated from the first space 23 in the housing 20 accommodating the electronic components 21 by the heat-receiving block 11, the pair of side wall members 15, and the lid member 16. Thus, flowing of air outside the housing 20 into a space between the cooler 10 and the housing 20 in the first space 23 is reduced. Thus, flowing of dust, water, or other substances into a space between the cooler 10 and the housing 20 in the first space 23 is reduced.

As described above, the cooler 10 according to Embodiment 2 includes the flow channel 14 for feeding air in the cooler 10. Thus, cooling by forced air-cooling may be performed in the in-vehicle device 2 without a duct for feeding cooling air. The in-vehicle device 2 is thus simpler than an in-vehicle device with a duct.

In a structure including a duct, the entire duct is to be treated to be waterproof and dustproof. A device to be installed on, in particular, a railway vehicle is larger and thus includes an elongated duct. In this structure, many portions are to be treated to be waterproof and dustproof, complicating the manufacturing process. In contrast, the in-vehicle device 2 according to Embodiment 2 includes no duct, and thus includes fewer portions to be treated to be waterproof and dustproof. The manufacturing process is thus simpler.

Embodiments of the present disclosure are not limited to the embodiments described above. The above embodiments may be combined. For example, as in the in-vehicle device 2, the internal space of the housing 20 in the in-vehicle device 1 may be divided into a first space 23 and a second space 24 by a partition member 22 having a main surface orthogonal to Y-direction. In this case, the partition member 22 may not have a second opening 22*a*. First openings 20*a* and 20*b* may be located in two surfaces of the housing 20 facing the first space 23 and facing each other in Z-direction.

The partition member 22 may be located in any manner other than the above examples. For example, in the housing 20 in the in-vehicle device 2, the partition member 22 may be located in the housing 20 with the main surface orthogonal to Z-direction. In this case, the second space 24 may be located, for example, vertically below, and the first space 23 may be located vertically above.

In the above embodiments, being fixed includes being integrally provided. For example, the heat-dissipating members 12 may be integrally provided with the heat-receiving block 11. When the heat-dissipating members 12 are integrally provided with the heat-receiving block 11, heat generated by the electronic components 21 is transferred more efficiently to air flowing through the flow channel 14 through the heat-receiving block 11 and the heat-dissipating members 12.

The pair of side wall members 15 may be integrally provided with the lid member 16. The pair of side wall members 15 that are integrally provided with the lid member 16 more reliably prevents dust, water, or other substances from flowing from the flow channel 14 into the internal space of the housing 20. The in-vehicle devices 1 and 2 may thus have improved sealability.

The heat-dissipating members 12 may have any shape other than in the examples described in the above embodiments. The heat-dissipating members 12 may have any shape that can transfer heat to air flowing through the flow channel 14. For example, the heat-dissipating members 12 may be protrusions extending away from the second main surface 11*b*. In this case, each heat-dissipating member 12 preferably has a tip thinner than a portion fixed to the second main surface 11*b*.

The heat-dissipating members 12 may be heat pipes. In this case, each heat-dissipating member 12 preferably includes a header pipe that is embedded in the heat-receiving block 11 and extending along the airflow in the flow channel 14, and a branch pipe connected to the header pipe and extending away from the heat-receiving block 11. A fan may be fixed to the branch pipe.

The vents 13*a* and 13*b* are not limited to two vents. For example, the channel definer 13 may define a flow channel 14 with branches, and may include one vent 13*a* for air to flow into the flow channel 14 and multiple vents 13*b* for air in the flow channel 14 to flow out.

The side wall members 15 and the lid member 16 may have any shape that can define the flow channel 14. The lid member 16 may be fixed to the main surfaces 15*a* of the side wall members 15.

To improve the sealability of the in-vehicle devices 1 and 2 further, portions in which the cooler 10 is to be in contact with the housing 20 are preferably treated to be waterproof and dustproof for being sealable. Similarly, portions in which the cooler 10 is to be in contact with the partition member 22 are preferably treated to be waterproof and dustproof for being sealable.

To improve the sealability of the in-vehicle devices 1 and 2, a filler member may fill a space between the cooler 10 and the housing 20. An in-vehicle device 3 illustrated in FIG. 8 further includes, in addition to the components of the in-vehicle device 1, a first housing sealing member 17*a* in contact with the cooler 10 and a periphery of the first opening 20*a*. In detail, the first housing sealing member 17*a* is in contact with the end face 11*c* of the heat-receiving block 11, the end faces 15*d* of the side wall members 15, and the end face 16*b* of the lid member 16 illustrated in FIG. 5, and the housing 20 around the first opening 20*a*. When the first housing sealing member 17*a* between the cooler 10 and the housing 20 is pressed and deformed, a space between the cooler 10 and the housing 20 is filled with the first housing sealing member 17*a*.

Figure 8:
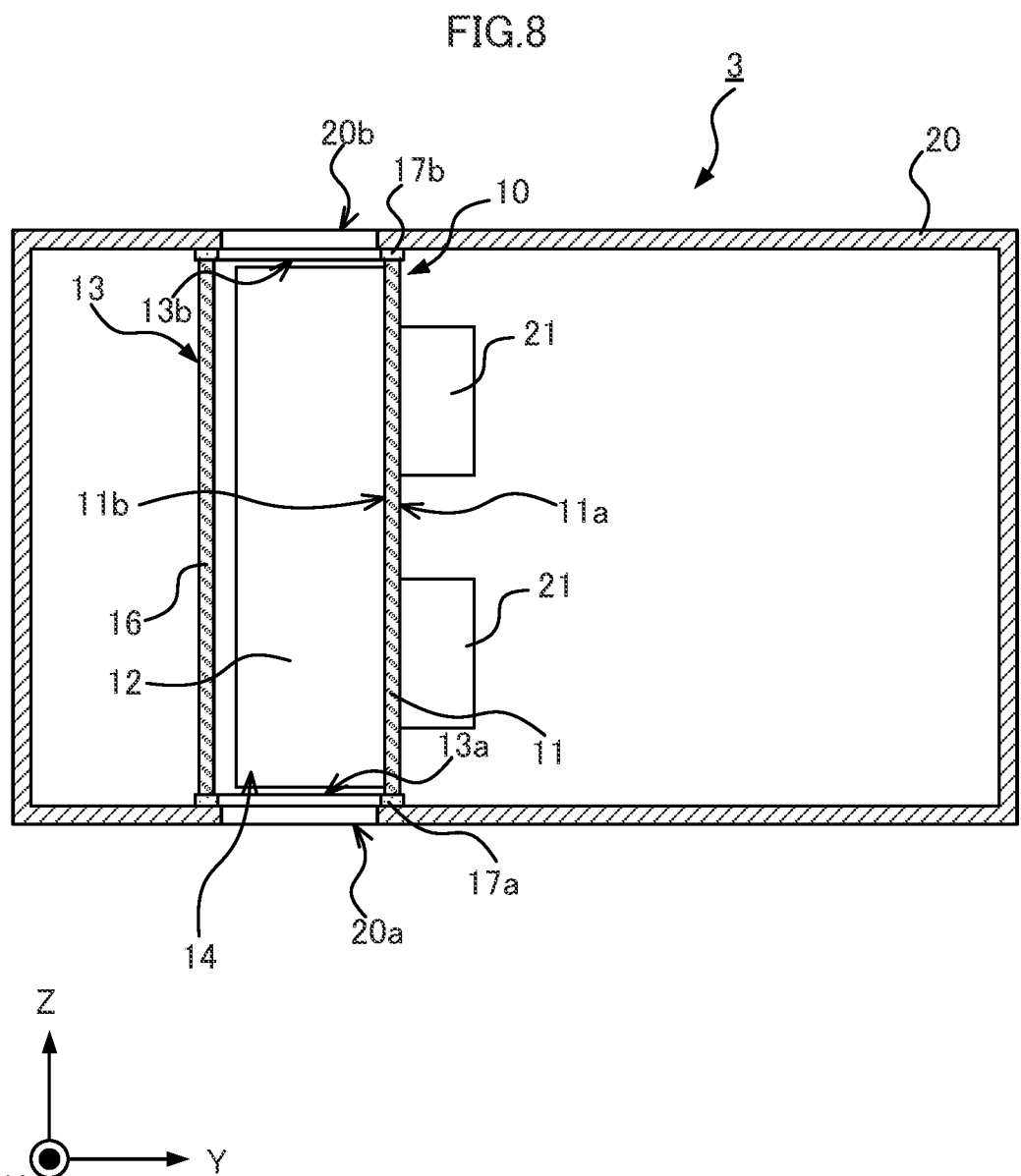
FIG. 8 is a cross-sectional view of an in-vehicle device according to a first modification of the embodiment.

The in-vehicle device 3 illustrated in FIG. 8 further includes a first housing sealing member 17*b* in contact with the cooler 10 and a periphery of the first opening 20*b*. In detail, the first housing sealing member 17*b* is in contact with the end face 11*d* of the heat-receiving block 11, the end faces 15*e* of the side wall members 15, and the end face 16*c* of the lid member 16 illustrated in FIG. 5, and the housing 20 around the first opening 20*b*. When the first housing sealing member 17*b* between the cooler 10 and the housing 20 is pressed and deformed, a space between the cooler 10 and the housing 20 is filled with the first housing sealing member 17*b*.

The first housing sealing members 17*a* and 17*b* may be, for example, gaskets. With the first housing sealing members 17*a* and 17*b*, flowing of air outside the housing 20 into the internal space of the housing 20 from the flow channel 14 is reduced.

To improve the sealability of the in-vehicle device 2, a filler member may fill a space between the cooler 10 and the partition member 22. An in-vehicle device 4 illustrated in FIG. 9 further includes, in addition to the components of the in-vehicle device 2, a first housing sealing member 17*c* in contact with the cooler 10 and a periphery of the first opening 20*d*. In detail, the first housing sealing member 17*c* is in contact with the end face 11*d* of the heat-receiving block 11, the end faces 15*e* of the side wall members 15, and the end face 16*c* of the lid member 16 illustrated in FIG. 5, and the housing 20 around the first opening 20*d*. When the first housing sealing member 17*c* between the cooler 10 and the housing 20 is pressed and deformed, a space between the cooler 10 and the housing 20 is filled with the first housing sealing member 17*c*.

Figure 9:
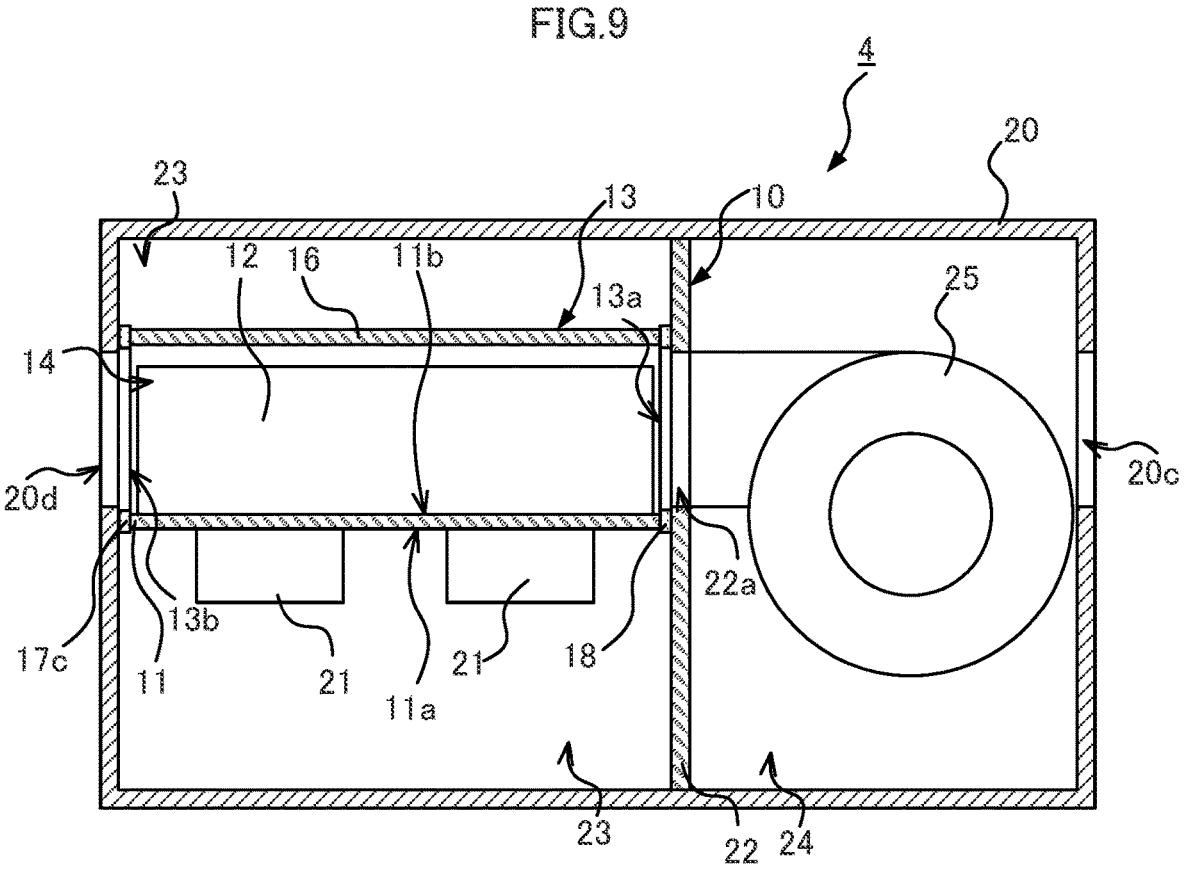
FIG. 9 is a cross-sectional view of an in-vehicle device according to a second modification of the embodiment.
Figure 9:
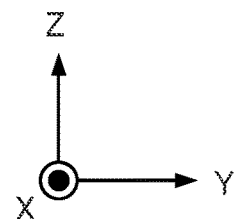

The in-vehicle device 4 illustrated in FIG. 9 further includes a second housing sealing member 18 in contact with the cooler 10 and a periphery of the second opening 22*a*. In detail, the second housing sealing member 18 is in contact with the end face 11*c* of the heat-receiving block 11, the end faces 15*d* of the side wall members 15, and the end face 16*b* of the lid member 16 illustrated in FIG. 5, and the partition member 22 around the second opening 22*a*. When the second housing sealing member 18 between the cooler 10 and the partition member 22 is pressed and deformed, a space between the cooler 10 and the partition member 22 is filled with the second housing sealing member 18.

The first housing sealing member 17*c* and the second housing sealing member 18 are, for example, gaskets. With the first housing sealing member 17*c* and the second housing sealing member 18, flowing of air outside the housing 20 into the first space 23 from the flow channel 14 is reduced.

The side wall members 15 illustrated in FIG. 5 are fixed to the heat-receiving block 11 in any manner other than fastening with fasteners described in Embodiment 1. For example, the side wall members 15 may be fixed to the heat-receiving block 11 by brazing. In this case, a brazing material reduces flowing of air into the internal space of the housing 20 accommodating the electronic components 21 from the flow channel 14. This eliminates waterproof and dustproof treatment in areas in which the side surfaces 15*b* of the side wall members 15 are to be in contact with the second main surface 11*b* of the heat-receiving block 11.

Similarly, the lid member 16 is fixed to the side wall members 15 in any manner other than fastening with fasteners described in Embodiment 1. For example, the lid member 16 may be fixed to the side wall members 15 by brazing. In this case, a brazing material reduces flowing of air into the housing 20 accommodating the electronic components 21 from the flow channel 14. This eliminates waterproof and dustproof treatment in portions in which the main surface 16*a* of the lid member 16 is to be in contact with the side surfaces 15*c* of the side wall members 15.

The first openings 20*a*, 20*b*, and 20*d* and the intake-exhaust port 20*c* may be at any positions other than in the above examples. These openings may be at any positions that allow air to flow into the flow channel 14 in the cooler 10 and then to flow out. For example, the intake-exhaust port 20*c* may be located in a surface that faces the second space 24 in the housing 20 included in the in-vehicle device 2 illustrated in FIG. 6 and is orthogonal to X-direction. When the blower is a centrifugal blower, air outside the housing 20 flows through the intake-exhaust port 20*c* into the second space 24 in the axial direction of the blower, or in other words, in X-direction. The air drawn by the blower is then discharged to the flow channel 14.

The blower 25 accommodated in the housing 20 may face in any direction in accordance with the direction in which the blower 25 draws and blows air. The blower 25 may be located outside the housing 20. For example, the blower 25 may be adjacent to the first opening 20*d* outside the housing 20 to blow air outside the housing 20 to the flow channel 14 through the first opening 20*d*. In this case, the air flowing through the first opening 20*d* into the flow channel 14 flows through the second opening 22*a* into the second space 24, and flows out of the housing 20 through the intake-exhaust port 20*c*.

The in-vehicle devices 1 to 4 are not limited to power conversion devices that convert power supplied from an overhead line to three-phase AC power appropriate for powering main electric motors, and may be any devices that include heating elements and are mountable on a vehicle. The in-vehicle devices 1 to 4 may be mounted on any movable body other than a railway vehicle, such as an automobile, an aircraft, or a ship. The housing 20 may be mounted on a roof of a railway vehicle.

The housing 20 may be mounted on a railway vehicle in any direction other than the direction in the above examples. For example, the in-vehicle device 1 may be mounted on a railway vehicle with the main surfaces of the heat-dissipating members 12 being orthogonal to Y-direction.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2, 3, 4 In-vehicle device
10 Cooler
11 Heat-receiving block
11*a* First main surface

11*b* Second main surface
11*c*, 11*d*, 15*d*, 15*e*, 16*b*, 16*c* End face
12 Heat-dissipating member
13 Channel definer
13*a*, 13*b* Vent
14 Flow channel
15 Side wall member
15*a*, 16*a* Main surface
15*b*, 15*c* Side surface
16 Lid member
17*a*, 176, 17*c* First housing sealing member
18 Second housing sealing member
20 Housing
20*a*, 20*b*, 20*d* First opening
20*c* Intake-exhaust port
21 Electronic component
22 Partition member
22*a* Second opening
23 First space
24 Second space
25 Blower
111, 112, 151, 152, 161, 162 End

The invention claimed is:

1. An in-vehicle device to be mounted on a vehicle, the in-vehicle device comprising:

a cooler, comprising:

a heat-receiving block with a first main surface to which a heating element is attachable;

a plurality of heat-dissipating members fixed to a second main surface of the heat-receiving block opposite to the first main surface with spaces therebetween, the plurality of heat-dissipating members being configured to dissipate heat transferred from the heating element through the heat-receiving block to air flowing through the spaces; and a channel definer covering the plurality of heat-dissipating members and fixed to the second main surface of the heat-receiving block, the channel definer defining a flow channel for the air flowing through the spaces between the plurality of heat-dissipating members, wherein the channel definer includes a plurality of vents for the air to flow into the flow channel and for the air drawn in the flow channel to flow out, the channel definer includes a pair of side wall members each being a plate and being fixed to the heat-receiving block in a direction in which main surfaces of the pair of side wall members face each other with the plurality of heat-dissipating members in between, and a lid member being a plate and being fixed to the pair of side wall members in a direction in which the lid member faces the second main surface of the heat-receiving block with the plurality of heat-dissipating members in between, the channel definer includes the plurality of vents including a vent being a space surrounded by first ends of the pair of side wall members, the lid member, and the heat-receiving block, and a vent being a space surrounded by second ends of the pair of side wall members, the lid member, and the heat-receiving block, and the flow channel defined by the channel definer extends along the pair of side wall members facing each other, wherein the in-vehicle device further comprises:

an electronic component being the heating element attached to the first main surface of the heat-receiving block included in the cooler and outside the flow channel; and a housing to accommodate the electronic component and an overall portion of the cooler, wherein the flow channel defined by the channel definer connects to outside the housing.

2. The in-vehicle device according to claim 1, further comprising:

a first channel sealing member filling a space between the heat-receiving block and each of the pair of side wall members to have sealability; and a second channel sealing member filling a space between the lid member and each of the pair of side wall members to have sealability.

3. The in-vehicle device according to claim 1, wherein the pair of side wall members and the heat-receiving block defining a same vent of the plurality of vents have ends with end faces smoothly connected to each other.

4. The in-vehicle device according to claim 3, wherein the pair of side wall members and the heat-receiving block defining the same vent have the ends with flush end faces.

5. The in-vehicle device according to claim 1, wherein the pair of side wall members are integrally provided with the heat-receiving block.

6. The in-vehicle device according to claim 1, wherein the pair of side wall members and the lid member defining a same vent of the plurality of vents have ends with end faces smoothly connected to each other.

7. The in-vehicle device according to claim 6, wherein the pair of side wall members and the lid member defining the same vent have the ends with flush end faces.

8. The in-vehicle device according to claim 1, wherein the plurality of heat-dissipating members are fins each with a main surface intersecting with a direction in which the pair of side wall members face each other.

9. The in-vehicle device according to claim 1, wherein the plurality of heat-dissipating members are integrally provided with the heat-receiving block.

10. The in-vehicle device according to claim 1, wherein the housing has at least one first opening connected to at least one of the plurality of vents in the channel definer, and the flow channel defined by the channel definer connects to outside the housing through the at least one first opening.

11. The in-vehicle device according to claim 10, further comprising:

a first housing sealing member to be in contact with an edge of at least one of the plurality of vents in the channel definer included in the cooler and an edge of the at least one first opening in the housing.

12. The in-vehicle device according to claim 1, further comprising:

a partition member dividing an internal space of the housing into (i) a first space to accommodate the electronic component and the overall portion of the cooler and (ii) a second space, wherein flowing of air outside the housing into a space between the cooler and the housing in the first space is reduced.

13. The in-vehicle device according to claim 12, wherein the partition member has a second opening connected to at least one of the plurality of vents in the channel definer, the flow channel defined by the channel definer is connected to the second space through the second opening, and the housing has a surface facing the second space with an intake-exhaust port through which air outside the housing flows into the second space or air in the second space flows out of the housing.

14. The in-vehicle device according to claim 13, further comprising:

a second housing sealing member to be in contact with an edge of at least one of the plurality of vents in the channel definer and an edge of the second opening in the partition member.

15. The in-vehicle device according to claim 1, further comprising:

an air blower to blow air outside the housing into the flow channel defined by the channel definer.

* * * * *